(12) United States Patent
Sofer et al.

(10) Patent No.: US 7,839,207 B2
(45) Date of Patent: Nov. 23, 2010

(54) INTEGRATED CIRCUIT AND A METHOD FOR RECOVERING FROM A LOW-POWER PERIOD

(75) Inventors: Sergey Sofer, Rishon Lezion (IL); Avi Elazary, Hod-Hashron (IL); Moshe Lavi, Hertzelia (IL)

(73) Assignee: Freescale Semiconductor, Inc., Austin, TX (US)

( * ) Notice: Subject to any disclaimer, the term of this patent is extended or adjusted under 35 U.S.C. 154(b) by 123 days.

(21) Appl. No.: 12/179,828

(22) Filed: Jul. 25, 2008

(65) Prior Publication Data

US 2010/0019836 A1    Jan. 28, 2010

(51) Int. Cl.
   *G11C 5/14*    (2006.01)
(52) U.S. Cl. .................. 327/544; 327/565; 365/229
(58) Field of Classification Search .................. None
   See application file for complete search history.

(56) References Cited

U.S. PATENT DOCUMENTS

| | | | |
|---|---|---|---|
| 5,880,604 A * | 3/1999 | Kawahara et al. | 326/83 |
| 6,433,584 B1 * | 8/2002 | Hatae | 326/80 |
| 7,092,307 B2 * | 8/2006 | Chen et al. | 365/226 |
| 7,158,404 B2 * | 1/2007 | Lai | 365/154 |
| 7,181,188 B2 | 2/2007 | Vu et al. | |
| 7,365,596 B2 * | 4/2008 | Padhye et al. | 327/544 |
| 2007/0168899 A1 | 7/2007 | Frenkil | |

* cited by examiner

*Primary Examiner*—Lincoln Donovan
*Assistant Examiner*—Terry L Englund

(57) ABSTRACT

An integrated circuit, including: (i) a power gated circuit which power supply is shut down during a low-power period; (ii) a retention circuit, coupled to the power gated circuit during at least a portion of a non-low-power period, the retention circuit is adapted to store, during the low-power period, state information reflecting a state of the power gated circuit before the low-power period started; (iii) a first portion of the power grid, coupled to the retention circuit and to a first end of a power supply switch, adapted to provide to the retention circuit a supply voltage during the low-power period and during a non-low-power period; wherein the power supply switch is open during the low-power period and is closed during the non-low-power period; and (iv) a second portion of the power grid, coupled to a second end of the power supply switch and to the power gated circuit; adapted to supply a gated supply voltage to the power gated circuit during the non-low-power period. The first portion of the power grid is characterized by intrinsic capacitance that is larger that the intrinsic capacitance of the second portion of the power grid.

18 Claims, 9 Drawing Sheets

Supplying a supply voltage (such as Vddc), by a first portion of a power grid that is coupled to a retention circuit and to a first end of a power supply switch. The other end of the power supply switch is connected to a second portion of the power grid. The power supply switch is open during a low-power period and is closed during the non-low-power period. 410

Supplying a gated supply voltage, by the second portion of the power grid that is coupled to a second end of the power supply switch and to a power gated circuit, a gated supply voltage before the low-power period. The first portion of the power grid is characterized by an intrinsic capacitance that is larger than a capacitance of the second portion of the power grid. 420

Receiving an indication that a low-power period is about to start and sending to a retention circuit (that is coupled to a power gated circuit) stage information reflecting a state of the power gated circuit. 430

Providing a substrate voltage supply to substrates of PMOS transistors of the power gated circuit during the low-power period. 442

Saving the state information in the retention circuit during the low-power period. 450

Providing a well voltage supply to wells of NMOS transistors of the power gated circuit during the low-power period. The substrate voltage supply and the well voltage supply are supplied also during non-low-power periods. 444

Starting the low-power period and maintaining the power gated circuit shut down. 440

Receiving an indication that the low-power period ends. 460

Recovering from the low-power period by closing (providing connectivity between the ends of the power supply switch) the power supply switch and providing the gated supply voltage to the power gated circuit. 470

INTEGRATED CIRCUIT AND A METHOD FOR RECOVERING FROM A LOW-POWER PERIOD

FIELD OF THE INVENTION

This disclosure relates generally to an integrated circuit and a method for recovering from a low-power period.

BACKGROUND OF THE INVENTION

The static power consumption of an integrated circuit can be reduced by completely shutting down the power supply of one or more modules (circuits) of the integrated circuit. These circuits' power supplies are shut down during one or more low-power periods. These circuits with the shut-down power supplies are also known as power-gated circuits as they receive a gated supply voltage during non-low-power periods and do not receive the gated supply voltage during the low-power period.

State retention power gating (SRPG) involves shutting down the power-gated circuits while saving their status during low-power periods. Integrated circuits in which this technique is implemented include retention circuits that store, during each low-power period, state information reflecting a state of a power-gated circuit.

The low-power period ends by performing a power up process (also referred as recovery process) during which the power supply voltage gating is removed and power supply voltage is provided to the power gated circuit and state information is sent to the power gated circuits.

A typical integrated circuit includes a very large number (hundreds, thousands, and even more) of SRPG flip-flops, each including a state retention circuit and a power gated circuit.

Retention circuits have very low power consumption and therefore are usually fed by a weak power grid that has a high resistance and a low capacitance and is susceptible to noises. These noises can result from powering up multiple SRPG flip-flops during a power up process that ends the low-power period. During this power up process main power grid sag and ground bounce can induce these noises. These noises cannot be adequately suppressed by the weak power grid and can cause state information errors. In order to reduce such noises the powering up process involves a slow increment of the gated supply voltage level and includes connecting the retention circuits to the power gated circuits in a sequential manner. Hence, a long powering up process is required.

In the example of FIG. 1 a single SRPG flip-flop is illustrated. It includes a single retention circuit and a single power gated circuit. It is noted that the number of SRPG flip-flops (and accordingly retention circuits and power gated circuits) can exceed one hundred, one thousand and even much more than one thousand.

FIG. 1 illustrates prior art integrated circuit 10. It includes weak power grid 30, main power grid 20, power gated circuit 40, retention circuit 50, power supply switch 60, logic switch 70 and voltage equalization switch 80.

Power gated circuit 40 is shut down during a low-power period. Retention circuit 50 is connected to power gated circuit 40 (when logic switch 70 is closed) during at least a portion of a non-low-power period. Retention circuit 50 is adapted to store, during the low-power period, state information reflecting a state of power gated circuit 40 before the low-power period started. After the low-power period ends, logic switch 70 is closed in order to allow the state information to be provided to power gated circuit 40.

Main power grid 20 is connected via power supply switch 60 to a power supply unit that provides (a constant) supply voltage Vddc 101. Power supply switch 60 is opened (disconnected) during low-power periods. A gated supply voltage Vddg 102 is provided by the power supply unit when the power supply switch 60 is closed (connected).

Voltage equalization circuit 80 is connected between main power grid 20 and weak secondary power grid 30 and is open during low-power periods.

Weak power grid 30 receives Vddc 101 even during low-power periods. It supplies Vddc 101 to retention circuit 50 during low-power periods and non-low-power periods.

Weak power grid 30 has a resistance, an inductance and a capacitance. They are represented in the example of FIG. 1 and FIG., 2 by inductor 32, resistor 31 and capacitor Cc 33. Main power grid 20 has a resistance, an inductance and a capacitance. The capacitance of main power grid 20 is represented in the example of FIG. 1 by capacitor Cg 21. In the example of FIG. 2, the resistance of main power grid 20 is represented by resistor 23, resistor 24 and resistor 25.

The resistance of weak power grid 30 is much larger than the resistance of main power grid 20. The intrinsic capacitance (the total capacitance of all components connected to it) of weak power grid 30 is much lower than the capacitance of main power grid 20. These differences exists because weak power grid 30 includes fewer conductors and narrower conductors than main power grid 20, as well as much fewer components like MOSFET devices or diodes, are connected to it. In the example of FIG. 2 resistor 31 has a resistance of about 20 Ohm, inducer 32 has an inductance of about 10 Nano-Henry. Resistors 23, 24 and 25, which in FIG. 2 represent the main power grid resistance, the power supply switch parasitic resistance in open state and the voltage equalization switch in open state have resistances of about 0.05 Ohm, 0.1 Ohm and about 1 Ohm respectively. An 'open state' refers to a state in which the resistance of the circuit is infinite while a closed state will have low or minimal resistance. An instantaneous current of about 5 Amperes flows through power gated circuit 40 (represented by current drain 41) during a power up process, and a current of about 0.1 Mili-Amperes flows through the retention circuit (represented by current drain 51). These currents cause noises that can affect the logic information stored in retention logic 50.

In the example of FIG. 3 a cross section of eight metal layers M1-M8 210-280 of integrated circuit 10 is shown.

A leftmost column of conductors 211, 221, 231, 241, 251, 261, 271 and 281 (each belonging to a separate metal layer) are connected to each other by VIAs 201. Conductor 211 of the lowest metal layer (M1) 210 is connected to a first end of power supply switch 60. The other end of power supply switch 60 is connected to another conductor 212 of M1 210 to provide to this conductor the gated supply voltage Vddg 102. Conductor 212 is connected by vias 202 to conductors 222, 223, 232, 242, 243, 252, 262, 263, 272 and 282 of metal layers M2-M8 220-280. Those skilled in the art may recognize widely used metal stack structure with metal lines organized in the way that all lines in even and odd metal layers are routed orthogonally.

Conductors 211, 212, 221, 222, 223, 231, 232, 241, 242, 243, 251, 252, 261, 262, 263, 271, 272, 281 and 282 form main power grid 20. Weak power grid 30 includes few narrow conductors 219, 229 and 239.

FIG. 4 is a timing diagram of a signals of the prior art integrated circuit.

Power up control signal 112 is asserted at a certain point in time—indicating that a low-power period should end.

The assertion of power up control signal 112 is followed by a gradual and time consuming increment in Vddg 102. This gradual and time consuming process (as well as the sequential switching of logic switches) prevents noises.

Once Vddg 102 reaches its pre-defined amplitude, the logic switches of multiple retention circuits can be closed (connected) in order to allow a gradual provision of retained state information to multiple power gated circuits. This is illustrated by the assertion of logic switch control signals collectively denoted 114.

SUMMARY OF THE PRESENT INVENTION

The present invention provides a method and a device as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects, and embodiments of the invention will be described, by way of example only, with reference to the drawings.

FIG. 9 schematically shows a flow chart of an example of an embodiment of a method.

DETAILED DESCRIPTION OF THE DRAWINGS

In the following specification, the invention will be described with reference to specific examples of embodiments of the invention. It will, however, be evident that various modifications and changes may be made therein without departing from the broader spirit and scope of the invention as set forth in the appended claims.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

It has been shown that the transition between a low-power period and a non-low-power period can be speeded up by using an integrated circuit that has a major power grid and a secondary power grid, wherein the major power grid is used to supply a supply voltage while the secondary power grid is used to selectively provide a gated supply voltage. Once a low-power period ends there is no need to charge up the capacitor, having the capacitance, equal to intrinsic capacitance of the major power grid but rather the smaller (lower capacitance) secondary power grid.

It has been shown that the transition between a low-power period and a non-low-power period can be further speeded up by providing a P-well voltage supply and, additionally or alternatively, an N-well voltage supply to N-type or P-type MOSFET transistors of a power gated circuit even during the low-power period. Once a low-power period ends there is no need to charge up the capacitors, having the capacitance equal to that of conductors that provide these supply voltages to the MOSFET transistors or/and junction diodes of bulks of these transistors.

It has been shown that the transitions between a low-power period and a non-low-power period can be further speeded up by providing a major power grid that reduces noises resulting from large instantaneous currents, flowing in the integrated circuit, when powering up the power gated circuit and thus prevents data retention failure resulting from a rapid power up process. The power up process can be equivalent to a conventional reset operation and can be performed simultaneously for multiple circuits (even the whole retention circuits) without loosing state information.

Figure 1:
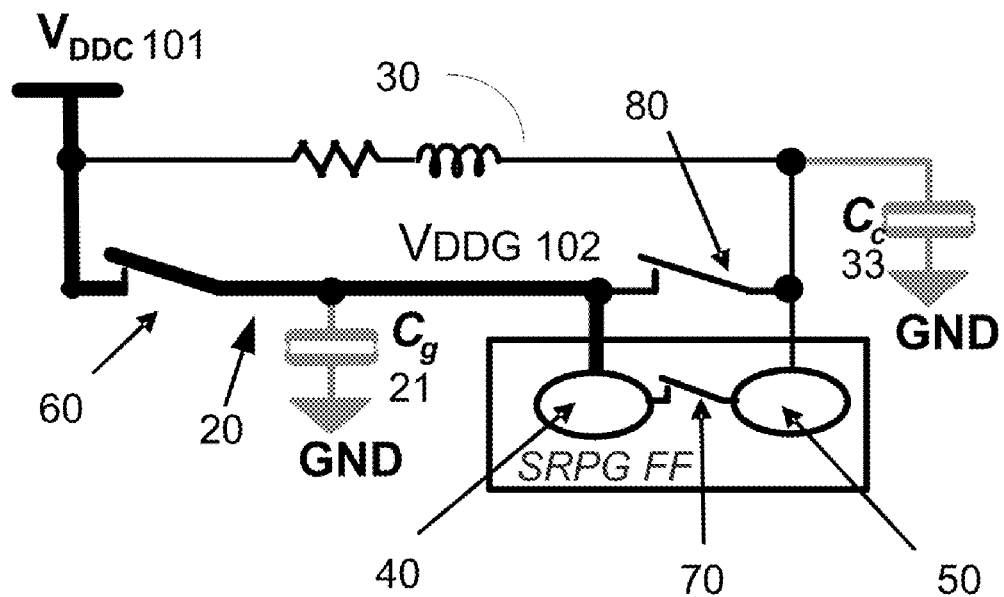
FIG. 1 illustrates a prior art integrated circuit.
Figure 2:
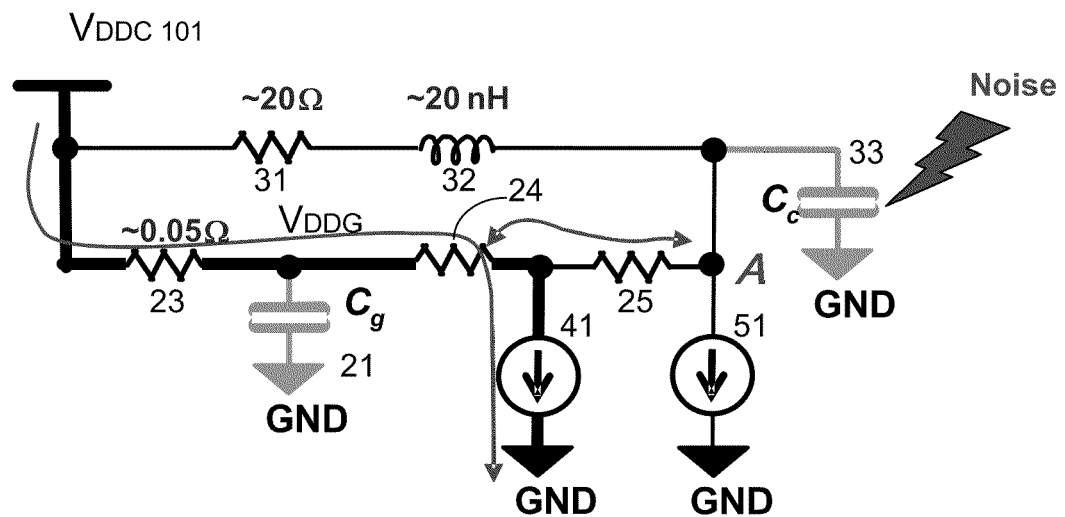
FIG. 2 illustrates a prior art integrated circuit and currents that flow through the integrated circuit.
Figure 3:
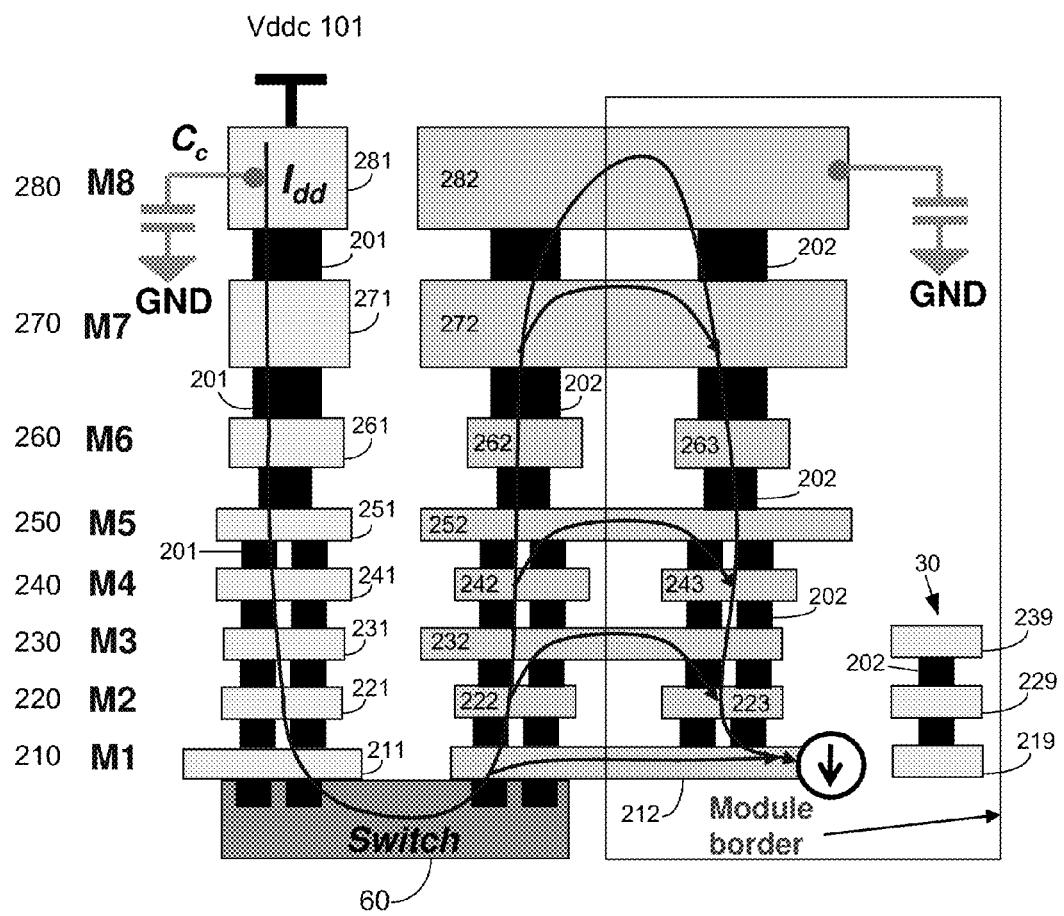
FIG. 3 illustrates a cross section of prior art power grids.
Figure 4:
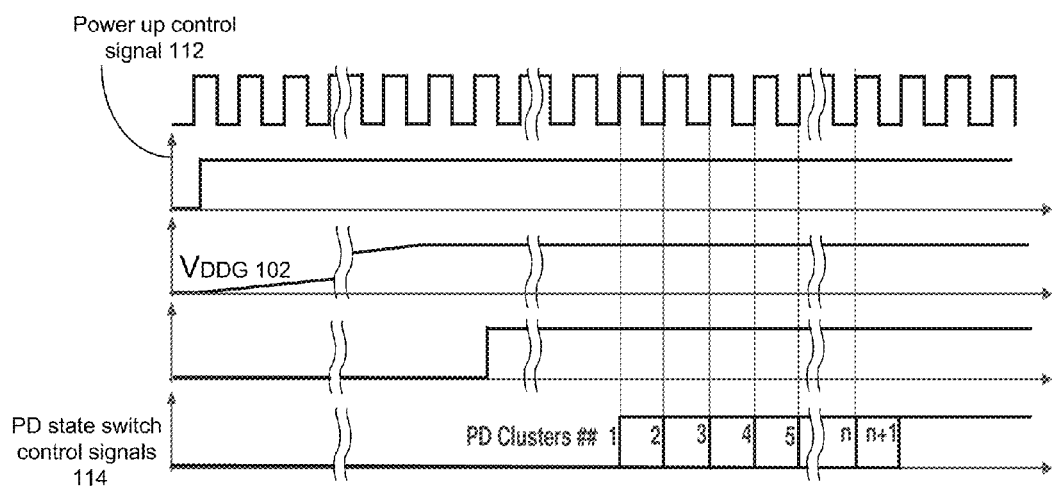
FIG. 4 is a timing diagram of a signals of the prior art integrated circuit.
Figure 5:
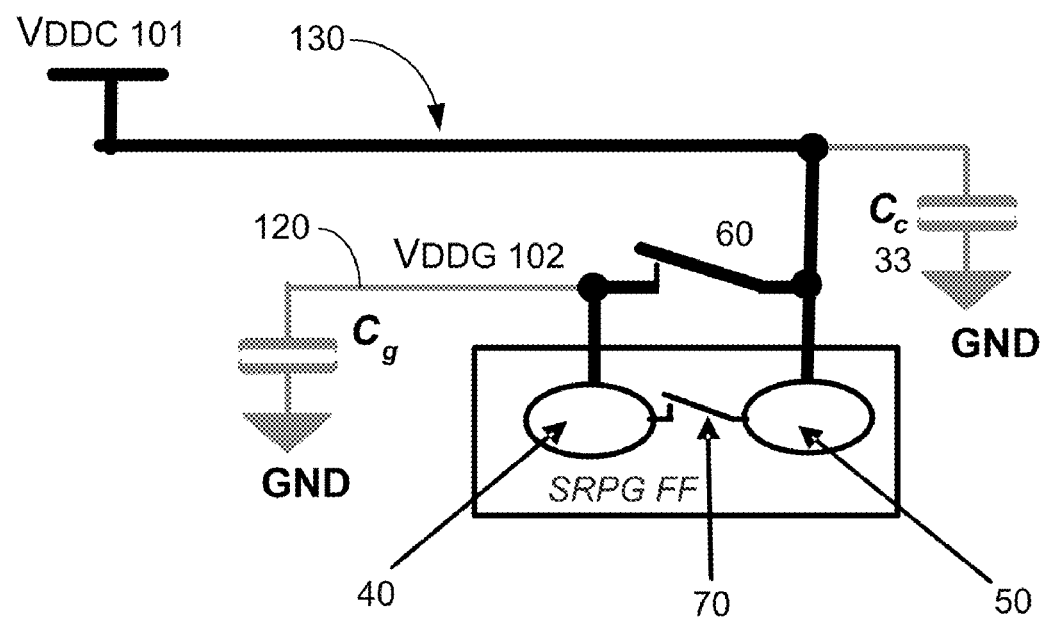
FIG. 5 schematically shows an example of an embodiment of an integrated circuit.

FIG. 5 schematically shows an example of an embodiment of integrated circuit 11.

Integrated circuit 11 includes a main power grid (also referred to as power grid) that includes first portion 130 and second portion 120, power gated circuit 40, retention circuit 50, power supply switch 60, and logic switch 70. First portion 130 of the power grid acts as a global and continuous power grid, while second portion 120 of the power grid acts as the local and interruptible power grid. Power gated circuit 40 is shut down during a low-power period. It can include flip-flops, logic gates and the like. Retention circuit 50 is connected to power gated circuit 40 (when logic switch 70 is closed) during at least a portion of a non-low-power period. Retention circuit 50 is adapted to store, during the low-power period, state information reflecting a state of power gated circuit 40 before the low-power period started. After the low-power period ends, logic switch 70 is closed in order to allow the state information to be provided to power gated circuit 40.

First portion 130 of the power grid is connected via power supply switch 60 to second portion 120. First portion 130 of the power grid provided Vddc 101 to the power supply switch 60 and to retention circuit 50. Power supply switch 60 is opened during low-power periods. Second portion 120 of the power grid provides gated supply voltage Vddg 102 to power gated circuit 40.

Figure 6:
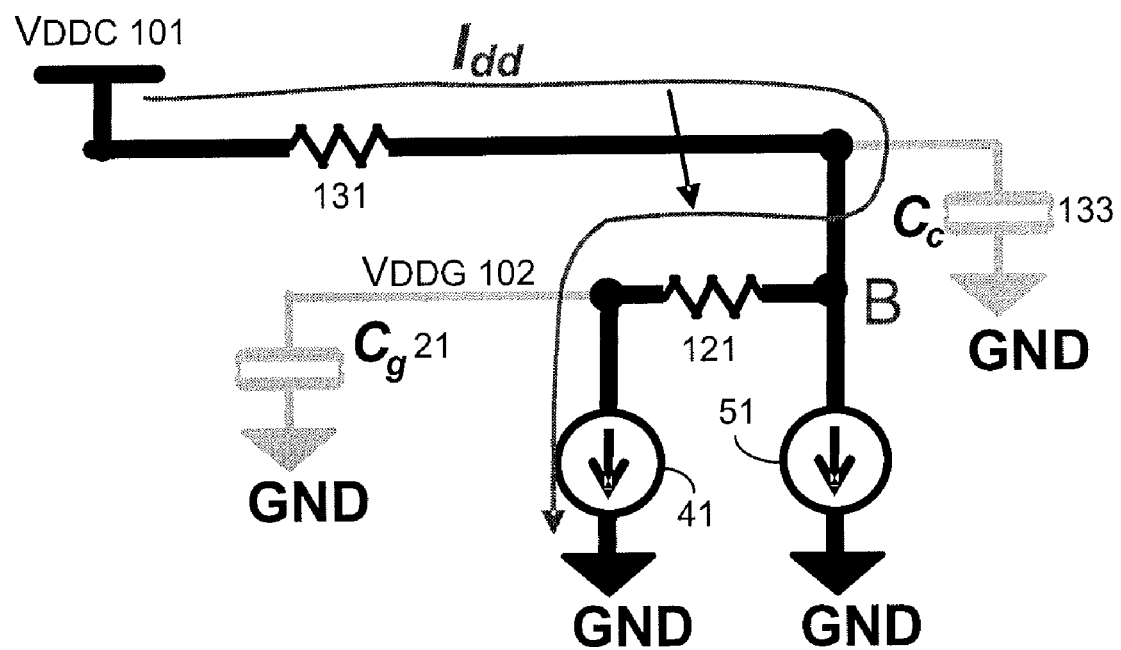
FIG. 6 schematically shows an example of an embodiment of an integrated circuit and current that flow through the integrated circuit.

First portion 130 of the power grid is characterized by a resistance and a capacitance. They are represented in the example of FIG. 6 by resistor 131 and capacitor Cc 133. Second portion 120 of the power grid is also characterized by a resistance and a capacitance. They are represented in the example of FIG. 6 by resistor 121, which represents the power supply switch resistance in open state and capacitor Cg 21.

The intrinsic capacitance of second portion 120 of the power grid is much lower than the intrinsic capacitance of first portion 130 of the power grid because second portion 120 of the power grid includes fewer and mainly local conductors than those of first portion 130.

In the example of FIG. 6 resistor 131 has a resistance of about 0.1 Ohm. Resistor 121 has a resistance of about 0.025 Ohm. An instantaneous current of about 5 Amperes flows through power gated circuit 40 (represented by current drain 41) during a power up process, and a current of about 0.1 Mili-Amperes flows through the retention circuit (represented by current drain 51). These currents do not cause noises that can affect the logic information stored in retention logic 50 as both currents propagate mostly through first portion 130.

Figure 7:
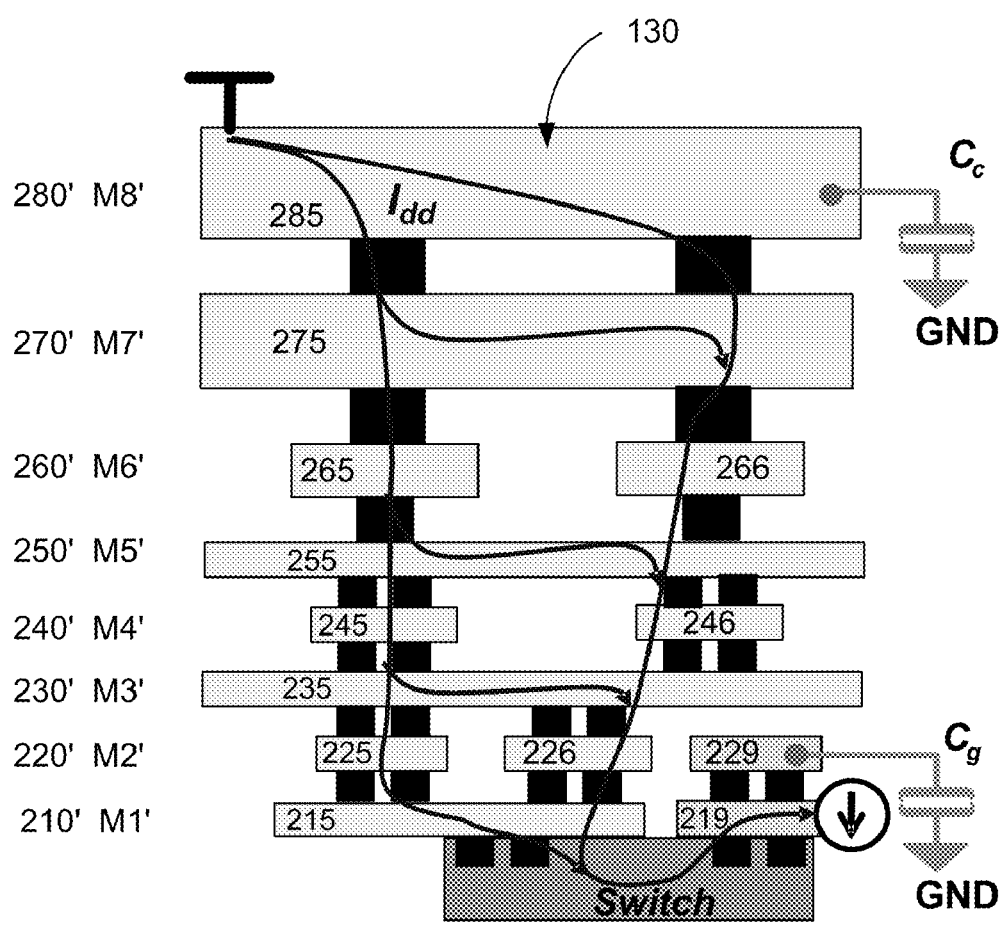
FIG. 7 schematically shows an example of an embodiment of power grids.

In the example of FIG. 7 a cross section of eight metal layers M'1-M'8 210'-280' is shown. First portion 130 of the power grid includes conductors 215, 225, 226, 235, 245, 246, 255, 265, 266, 275 and 285. The up most conductor 285 can be very large and, additionally or alternatively, can be contacted by external connectors (for providing Vddc 101) that are located at various location such as near the center of integrated circuit 11 or near the edges of integrated circuit 11.

Most metal layers (for example—metal layers M'3-M'8 230'-280') include only conductors of the first portion 130 of the power grid—global power grid. Only a minority of the metal layers (for example—metal layers M'1 and M'2 210' and 220') include conductors of both portions 120 and 130 of the power grid.

Although not illustrated in the example of FIG. 7, a vertical separation of conductors can be achieved by allocating one or few metal layers for conductors of second portion 120 of the power grid that acts as a local power grid only while other metal layers are allocated for conductors of first portion 130 of the power grid that acts as a global power grid.

Figure 8:
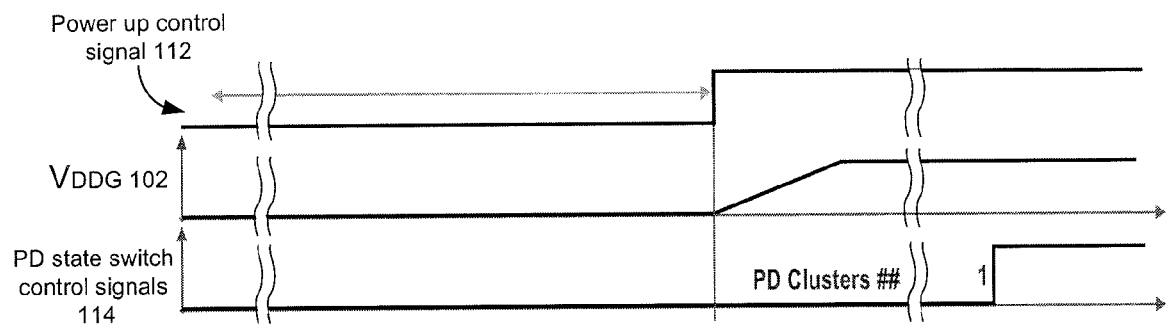
FIG. 8 schematically shows an example of a timing diagram of signals of an embodiment of an integrated circuit.

FIG. 8 is a timing diagram of signals of the embodiment of the integrated circuit.

Power up control signal 112 is asserted at a certain point in time—indicating that a low-power period should end.

The assertion of power up control signal 112 is followed by a fast increment of Vddg 102. Because retention circuit 50 is coupled to first portion 130 of the power grid it is not subjected to state information errors.

The fast increment in Vddg 102 is followed by a fast (non-gradual) assertion of control signals to all logic switches—this is illustrated by an assertion of logic switch control signal 114.

FIG. 9 illustrates an example of an embodiment of method 400 for recovering from a low-power period.

Method 400 starts by stages 410 and 420.

Stage 410 includes supplying a supply voltage (such as Vddc), by a (so called main) power grid that includes a first portion and a second portion. The first portion of the power grid is connected to a retention circuit and to a first end of a power supply switch. This first portion of the power grid is the continuous voltage power grid. The other end of the power supply switch is connected to a second portion of the power grid. This second portion of the power grid is the interruptible voltage power grid. The power supply switch is open during a low-power period and is closed during the non-low-power period.

Stage 410 can include at least one of the following: (i) supplying the supply voltage to an integrated circuit that includes multiple metal layers; wherein a topmost metal layer of the integrated circuit includes only conductors of the first portion; (ii) supplying the supply voltage to an integrated circuit that includes multiple metal layers wherein a topmost metal layer of the integrated circuit includes only conductors of the first portion; and wherein the topmost metal layer includes conductors that are connectable by external connectors located substantially near a center of the integrated circuit and are connectible by external connectors located substantially at an edge of the integrated circuit; (iii) supplying the supply voltage to an integrated circuit that includes multiple metal layers; wherein a majority of the multiple metal layers consists only conductors of the first portion; (iv) supplying the supply voltage to an integrated circuit that includes multiple metal layers; wherein each metal layer includes conductors of a single portion (out of the first portion and the second portion) of the power grid.

Stage 420 includes supplying a gated supply voltage, by the second portion of the power grid that is coupled to a second end of the power supply switch and to a power gated circuit, a gated supply voltage before the low-power period. The first portion of the power grid is characterized by an intrinsic capacitance that is larger than the intrinsic capacitance of the second portion.

Stage 420 is followed by stage 430 of receiving an indication that a low-power period is about to start and sending to a retention circuit (that is coupled to a power gated circuit) stage information reflecting a state of the power gated circuit.

Stage 430 is followed by stages 440 and 450.

Stage 440 includes starting the low-power period and maintaining the power gated circuit shut down.

Stage 440 can include at least one of the following: (i) stage 442 of providing a substrate voltage supply to substrates of PMOS transistors of the power gated circuit during the low-power period; (ii) stage 444 of providing a well voltage supply to wells of NMOS transistors of the power gated circuit during the low-power period. The substrate voltage supply and the well voltage supply are supplied also during non-low-power periods.

Stage 450 includes retaining the state information in the retention circuit during the low-power period.

Stage 440 and 450 are followed by stage 460 of receiving an indication that the low-power period ends.

Stage 460 is followed by stage 470 of recovering from the low-power period by closing (providing connectivity between the ends of the power supply switch) the power supply switch and providing the power supply voltage to the power gated circuit.

Stage 470 can include at least one of the following: (i) reducing, by the first portion, retention circuit noises resulting from powering up the power gated circuit; (ii) preventing, by the first portion state information errors resulting from a rapid power up process; (iii) concurrently connecting multiple retention circuits to multiple power gated circuits.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

In addition, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

However, other modifications, variations, and alternatives are also possible. The specifications and drawings are, accordingly, to be regarded in an illustrative rather than in a restrictive sense.

The word 'comprising' does not exclude the presence of other elements or steps then those listed in a claim. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

We claim:

1. An integrated circuit, comprising:
    a power gated circuit that is shut down during a low-power period;
    a retention circuit, coupled to the power gated circuit during at least a portion of a non- low-power period, the retention circuit is adapted to store, during the low-power period, state information reflecting a state of the power gated circuit before the low-power period started;
    a first portion of a power grid, coupled to the retention circuit and to a first end of a power supply switch, adapted to provide to the retention circuit a supply voltage during the low-power period and during a non-low-power period; wherein the power supply switch is open during the low-power period and is closed during the non-low-power period; and
    a second portion of the power grid, coupled to a second end of the power supply switch and to the power gated circuit; adapted to supply a gated supply voltage to the power gated circuit during the non-low-power period;
    wherein the first portion of the power grid is characterized by intrinsic capacitance that is larger than an intrinsic capacitance of the second portion of the power grid; and
    wherein the integrated circuit comprises multiple metal layers; wherein a topmost metal layer of the integrated circuit comprises only conductors of the first portion of the power grid.

2. The integrated circuit according to claim 1 wherein the topmost metal layer comprises conductors that are connectable by external connectors located substantially near a center of the integrated circuit and are connectible by other external connectors located substantially at an edge of the integrated circuit.

3. The integrated circuit according to claim 1 wherein a majority of the multiple metal layers comprise only conductors of the first portion of the power grid.

4. The integrated circuit according to claim 1 wherein conductors of the second portion of the power grid are included in one or more down most metal layers of the multiple metal layers.

5. The integrated circuit according to claim 1 wherein a majority of the multiple metal layers comprise only conductors of the first portion of the power grid and wherein a minority of the multiple metal layers comprise conductors of the first and second portions of the power grid.

6. The integrated circuit according to claim 1 wherein each metal layer comprises conductors of only a single portion of the power grid.

7. The integrated circuit according to claim 1 wherein the retention circuit comprises PMOS transistors and wherein the integrated circuit comprises multiple conductors that are coupled to a supply source to provide to bulks of the P-MOSFET transistors an N-well supply voltage during the low-power period and during the non-low-power period.

8. The integrated circuit according to claim 1 wherein the retention circuit comprises NMOS transistors and wherein the integrated circuit comprises multiple conductors that are coupled to a supply source to provide to bulks of the N-MOSFET transistors a P-well supply voltage during the low-power period and during the non-low-power period.

9. The integrated circuit according to claim 1 wherein the first portion of the power grid reduces retention circuit noises resulting from instantaneous current, characteristic of the process of powering up the power gated circuit.

10. The integrated circuit according to claim 1 wherein the characteristics of the first portion of the power grid prevents state information errors resulting from a rapid power up process.

11. A method for recovering from a low-power period, the method comprises:
    supplying a supply voltage, by a first portion of a power grid that is coupled to a retention circuit and to a first end of a power supply switch, during a non-low-power period;
    wherein the power supply switch is open during a low-power period and is closed during the non-low-power period;
    supplying a gated supply voltage, by a second portion of the power grid that is coupled to a second end of the power supply switch and to a power gated circuit, a gated supply voltage before the low-power period; wherein the first portion of the power grid is characterized by intrinsic capacitance that is larger than the intrinsic capacitance of the second portion of the power grid;
    saving, at the retention circuit that is coupled to the power gated circuit, during the low- power period, state information reflecting a state of the power gated circuit before the low-power period started;
    recovering from the low-power period by closing the power supply switch and providing the gated supply voltage to the power gated circuit; and
    supplying the supply voltage to an integrated circuit that comprises multiple metal layers;
    wherein a topmost metal layer of the integrated circuit comprises only conductors of the first portion of the power grid.

12. The method according to claim 11 wherein the topmost metal layer comprises conductors that are connectable by external connectors located substantially near a center of the integrated circuit and are connectible by other external connectors located substantially at an edge of the integrated circuit.

13. The method according to claim 11 wherein a majority of the multiple metal layers comprise only conductors of the first portion of the power grid.

14. The method according to claim 11 wherein each metal layer comprises conductors of a single part of the power grid only.

15. The method according to claim 11 comprising providing a substrate voltage supply to bulks of P-MOSFET transistors of the power gated circuit during the low-power period and during the non-low-power period.

16. The method according to claim 11 comprising:
providing a P-well voltage supply to bulks of N-MOSFET transistors of the power gated circuit during the low-power period and during the non-low-power period; and
providing an N-well voltage supply to bulks of P-MOSFET transistors of the power gated circuit during the low-power period and during the non-lowpower period.

17. The method according to claim 11 comprising reducing, by the characteristics of the first portion of the power grid, retention circuit noises resulting from instantaneous current, characteristic of the process of powering up the power gated circuit.

18. The method according to claim 11 comprising preventing, by the characteristics of the first portion of the power grid the state information errors resulting from a rapid power up process.

* * * * *